United States Patent [19]

Hu

[11] 3,920,481

[45] Nov. 18, 1975

[54] PROCESS FOR FABRICATING INSULATED GATE FIELD EFFECT TRANSISTOR STRUCTURE

[75] Inventor: Daniel C. Hu, San Jose, Calif.

[73] Assignee: Fairchild Camera and Instrument Corporation, Mountain View, Calif.

[22] Filed: June 3, 1974

[21] Appl. No.: 475,357

[52] U.S. Cl. .................... 148/1.5; 148/187; 29/571; 357/42

[51] Int. Cl.² ........................................ H01L 21/265

[58] Field of Search ............... 148/1.5, 187; 29/571; 357/42, 49

[56] References Cited

UNITED STATES PATENTS

| | | | |
|---|---|---|---|
| 3,356,858 | 12/1967 | Wanlass | 357/42 X |
| 3,411,051 | 11/1968 | Kilby | 357/49 |
| 3,748,545 | 7/1973 | Beale | 357/42 X |
| 3,755,001 | 8/1973 | Kooi et al. | 148/1.5 |
| 3,793,088 | 2/1974 | Eckton, Jr. | 148/1.5 |
| 3,806,371 | 4/1974 | Barone | 148/1.5 |
| 3,812,519 | 5/1974 | Nakamura et al. | 148/187 X |

*Primary Examiner*—C. Lovell
*Assistant Examiner*—J. M. Davis
*Attorney, Agent, or Firm*—Alan H. MacPherson; Norman E. Reitz

[57] ABSTRACT

An improved and simplified process for fabricating a complementary insulated gate field effect transistor structure having complementary p-channel and n-channel devices in the same semiconductor substrate wherein the source/drain regions of at least one of the complementary p-channel or n-channel field effect devices are formed by the steps of introducing an impurity of one conductivity type and then introducing an impurity of the opposite conductivity type, one of the impurities having a relatively greater concentration than the other so that the one impurity counterdopes the other and the source/drain regions are characterized by the conductivity type of the one impurity.

12 Claims, 9 Drawing Figures

PROCESS FOR FABRICATING INSULATED GATE FIELD EFFECT TRANSISTOR STRUCTURE

BACKGROUND OF THE INVENTION

This invention relates to a process for fabricating complementary field effect transistor structures and, more particularly, to an improved and simplified process for fabricating a complementary field effect transistor structure wherein the source/drain regions of at least one of the complementary p-channel or n-channel field effect devices are formed by the steps of introducing an impurity of one conductivity type and then introducing an impurity of the opposite conductivity type, one of the impurities having a relatively greater concentration than the other so that the one impurity counterdopes the other and the source/drain regions are characterized by the conductivity type of the one impurity.

DESCRIPTION OF THE PRIOR ART

Complementary field effect circuit arrangements employ n-channel and p-channel field effect transistors which are coupled so that the source or drain of one device is connected to the source or drain of the other device. In any mode of circuit operation, one of the devices will be functioning and the other will be off. When operating conditions within the circuit dictate that the functioning device turns off, the device which was previously off will begin to function due to interconnection of the sources and/or drains of the two devices. This concept was first disclosed by Wanlass in U.S. Pat. No. 3,356,858. It is especially useful because no additional power is required to switch either of the devices. Switching is an inherent attribute of circuit operation.

Conventional complementary field effect devices are fabricated as conductor-insulator-semiconductor structures with interconnections between particular sources or drains of the n-channel and p-channel devices. The conductors may be metal or conductive polycrystalline silicon. Silicon dioxide is the most widely used insulator, and single crystal silicon is the most widely used semiconductor substrate. Typical complementary metal oxide semiconductor (CMOS) structures are fabricated on an n-type substrate rather than on a p-type substrate because it is easier to obtain desirable threshold voltages for both the n-channel and p-channel complementary devices. The p-well required for the n-channel complement is obtained by diffusing a lightly doped p-region into the n-type substrate. In some devices all n-channel devices are fabricated in a common p-well, and p-channel devices are fabricated in the n-substrate so that much of the overall area is taken up with interconnections between the n-channel and p-channel devices. Where individual p-wells are used for the n-channel devices, isolation of the p-channel field-effect transistors is sometimes achieved by heavily doped channel stops. These channel stops occupy a large amount of wafer surface area, degrade operating speed and limit the voltage range. Recently, polycrystalline silicon has been used in place of metal for the gate electrode of the devices, but although transient performance is slightly improved, a negligible reduction in area has been effected. Also, the standard dopant, boron, which is placed in the polycrystalline silicon to render it conductive and to obtain a low threshold, possesses the property that it may diffuse through the gate oxide in the presence of hydrogen and degrade the device. And, prior-art CMOS devices are known to experience impurity migration through both the gate and field oxides with resultant impairment of the operating characteristics of the devices. Finally, the presence of uncontrolled amounts of fixed surface state charges, due typically to non-stoichiometric composition of the $SiO_2$, also impairs the operating characteristics of the devices.

As recited in the copending patent application of Bruce E. Deal and Daniel C. Hu, entitled "COMPLEMENTARY INSULATED GATE FIELD EFFECT TRANSISTOR STRUCTURE AND PROCESS FOR FABRICATING THE STRUCTURE," Ser. No. 475,385 filed June 3, 1974, assigned to the same assignee as the present application, a new structure and process technology has been developed to fabricate complementary insulated gate field-effect structures which overcome the deficiencies of the prior art. As disclosed in the copending application, the process for fabricating complementary field effect structures and the structure realized incorporate oxide isolation of the active device regions, counterdoping of the p-well with impurities of opposite type to obtain a desirable composite doping profile, reduction of $Q_{ss}$ in the isolation oxide, doping of the gate and field oxides with a chlorine species, and phosphorus doping of the polycrystalline silicon gates. The structures produced by this process technology are smaller, have better operating characterisctics and can be produced with high yields. As described in this copending application, an inherent requirement in the fabrication of p-channel and n-channel complementary devices in the same semiconductor substrate is the individual definition of the source/drain regions of the respective devices and introduction of appropriate impurities to them. Such an apparent inherent requirement is a yield-limiting factor since process complexity is proportional to achievable yield. It would be desirable, then, to form the source/drain regions of both the p-channel and n-channel devices by employing the same process steps.

In transistor electronics, it is known that an increase in the width of the space charge region surrounding a semiconductor junction is accompanied by an increase in the junction avalanche breakdown voltage. Increase in the width of the space charge region can be brought about by decreasing the background concentration of the substrate in which the junction is formed or by decreasing the overall magnitude of the doping of the diffused region or at least the slope of the doping profile of that region in the vicinity of the junction. With field-effect devices generally, it is known that breakdown across the junction of the drain and the bulk substrate may occur under severe loading conditions. In CMOS structures in which the n-channel device is fabricated in an implanted p-well, breakdown could occur across the n-type drain/p-well junction. Thus, it would be generally desirable to effect an increase in the junction avalanche breakdown voltage across this junction.

SUMMARY OF THE INVENTION

A process for fabricating a complementary insulated gate field-effect transistor structure is provided in which n-channel and p-channel devices are fabricated in the same semiconductor substrate. The process includes the steps of forming a well of a first conductivity type in a substrate of a second and opposite conductivity type, forming a conductor-insulator-semiconductor field-effect device having a first channel conductivity type within the well and forming a conductor-insulator-semiconductor field-effect device having a second channel conductivity type in the substrate. The process is characterized by forming the source/drain regions of the conductor-insulator-semiconductor devices by introducing an impurity of a first conductivity type into the source/drain regions of both of the devices, and introducing an impurity of a second conductivity type opposite to the first conductivity type into the source/drain regions of the device having the second channel conductivity type, the concentration of the impurity of the second conductivity type being greater than the concentration of the impurity of the first conductivity type so that the impurity of the second conductivity type counterdopes the impurity of the first conductivity type to produce source/drain regions of the second conductivity type.

BRIEF DESCRIPTION OF THE DRAWINGS

For a more complete understanding of the process of the present invention, reference may be had to the drawings which are incorporated herein by reference and in which.

DESCRIPTION OF THE PREFERRED EMBODIMENTS

Figure 1:
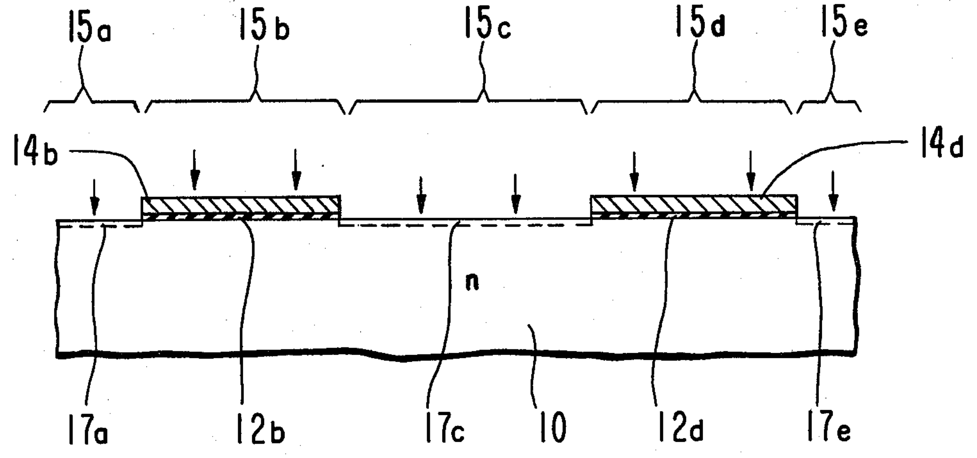
FIG. 1 illustrates an intermediate process step after selective formation of a layer of silicon dioxide 12 on n-substrate 10, selective formation of a region of oxidation masking material 14 and introduction of a field implant to regions 17*a*, 17*c* and 17*e;*

Referring now to FIG. 1, the substrate 10 is shown, in this preferred embodiment, to be n-conductivity-type silicon. With an n-conductivity-type substrate and associated p-well, the threshold voltages of the two complementary devices are matched more closely than is possible for devices in a p-conductivity-type substrate and associated n-well, if the compensating effect of p-well implantation is considered. Complementary devices formed in a p-type substrate with an associated n-well could have matched threshold voltage provided an additional impurity was introduced underneath the gate of the p-channel device. With this proviso, the disclosure herein of complementary field-effect devices formed in an n-substrate and associated p-well also pertains to complementary field-effect devices formed in a p-substrate and associated n-well with the appropriate substitution of analogous process steps.

A layer of oxidation masking material 14 is applied to the surface of substrate 10. This material serves to mask the active device regions while isolation regions are grown. It has been found advantageous to interpose a layer of silicon dioxide 12 between oxidation masking material 14 and the silicon substrate 10 in order to prevent defects in the substrate upon cooling and provide a more desirable geometry to the isoplanar oxide islands. The inclusion of a silicon dioxide layer 12 appears to reduce structural stresses experienced by the substrate upon cooling. For example, if the oxidation masking material 14 is silicon nitride, $Si_3N_4$, the silicon dioxide layer 12 will be in a state of compression while the silicon nitride 14 will be in a state of tension with respect to the silicon substrate due to the differences in coefficient of thermal expansion. The countervailing forces may protect the substrate. As shown, both the silicon dioxide and the silicon nitride are defined by carrying out a photoresist masking sequence to protect active device regions 15*b* and 15*d* and to expose isolation regions 15*a*, 15*c* and 15*e*.

As used above and throughout this specification, the phrase "photoresist masking sequence" refers to the well-known sequence of applying a uniform layer of a photoresist polymer, selectively exposing the photoresist by radiation of appropriate wavelength, developing the photoresist to leave a desired pattern, performing an active step such as diffusion or forming metal contacts, and removing the photoresist polymer. A complete photoresist masking sequence is also called a masking step. The details of each individual masking step are not shown in the drawings and should be inferred from the use of the term "masking step."

An n-type field implant, typically arsenic, is then introduced into field insulation regions 15*a*, 15*c* and 15*e*. Preferably the field implant is introduced by ion implantation because the dosage and energy of implantation can be carefully controlled. However, the field implant may also be introduced by diffusion. In either case the impurity atoms enter the surface of the substrate and repose at a shallow depth. This step is called predeposition. The silicon nitride overlying the silicon dioxide in the active device regions 15*b* and 15*d* masks the substrate regions and prevents any of the field implant impurity from reaching substrate 10. When driven into the substrate, such a field implant raises the surface concentration of n-type impurities in the n-substrate 10 and prevents inversion of the substrate underneath the field insulation regions. Such inversion would occur between p-type source/drain regions of the p-channel device and the p-well, i.e., between source/drain region 36*d* and p-well 23*d* of FIG. 4. This inversion could connect the $p^+$-source/drain with all p-wells in a circuit since they are likely tied electrically at the same potential, thereby rendering the circuit disfunctional. In effect, the implant forms a channel stop but requires much less surface area. The concentration of the field implant is typically about one order to magnitude lower than either the substrate or p-well concentrations so that even though the n-type implant reduces the p-conductivity-type concentration and enhances the likelihood of inversion of the p-well between the n-type source/drain regions of the n-channel device and the n-substrate 10, the p-well is relatively so heavily doped beneath shallow well depths that the net p-type concentration under the isolation islands remains high enough to prevent inversion of the p-well for voltages up to about 25 volts.

Figure 2:
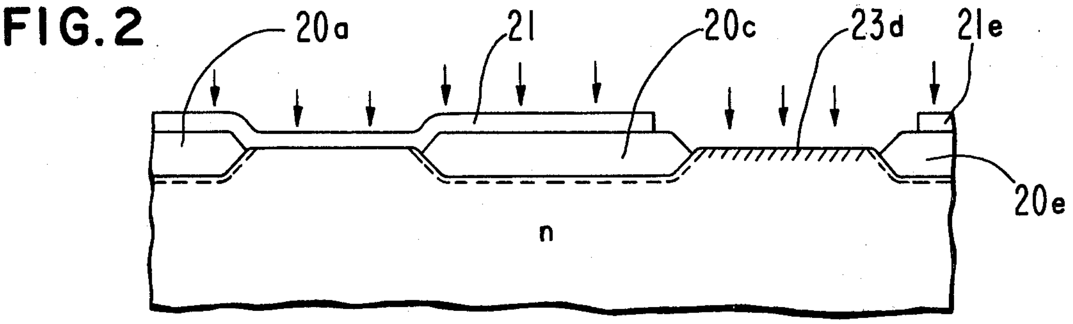
FIG. 2 is a further view of FIG. 1 after growth of isoplanar isolation oxide 20, removal of oxidation masking material 14 and layer of silicon dioxide 12, application of photoresist layer 21 and introduction of p-well double ion implant 23*d;*
Figure 3:
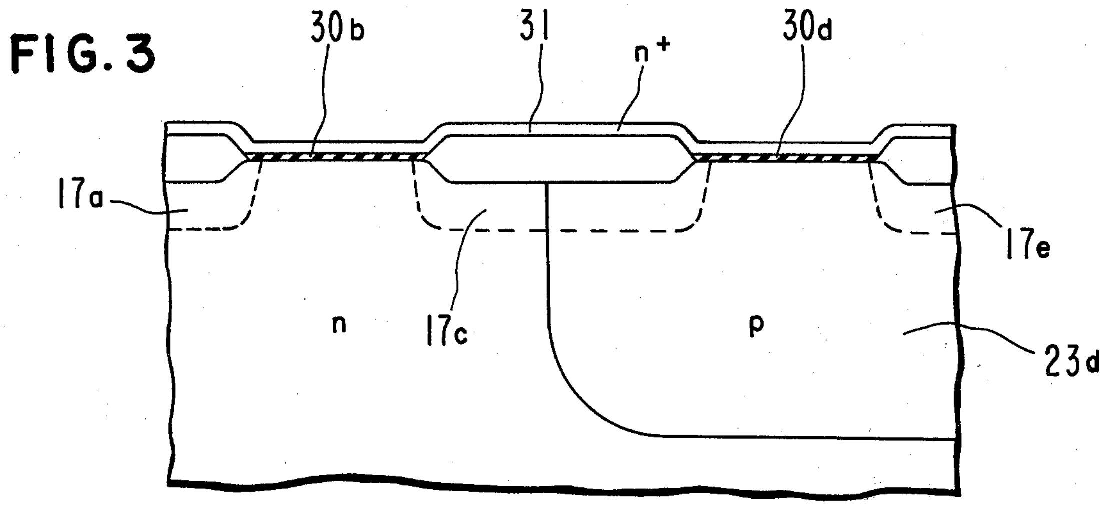
FIG. 3 is a further view of FIG. 2 after thermal drive in of the p-well implant to form p-well 23*d* and of the field implant to form expanded field implant regions 17*a*, 17*c* and 17*e*, thermal growth of the gate oxide 30 and deposition of polycrystalline silicon layer 31.

Referring now to FIG. 2, isolation islands 20 are formed in isolation regions 15*a*, 15*c* and 15*e*. Several versions of oxide isolation have been developed commercially. Generally, they include surrounding active device regions with thick layers of silicon dioxide, also called field oxide. The isoplanar process as set forth in U.S. Pat. No. 3,648,125 is one such process. In the isoplanar process, silicon dioxide is grown from the silicon substrate by application of an oxidizing agent such as oxygen or water vapor at a temperature in the range of 900° – 1,250°C. In one embodiment, a 1.8$\mu$ layer of isolation oxide is grown by subjecting the substrate to a temperature of 1,000°C. in a wet oxygen ambient for 16 hours. The general thermal oxidation kinetics of this silicon dioxide growth have been reported previously. See B. E. Deal and A. S. Grove, "General Relationship for the Thermal Oxidation of Silicon," *Journal of Applied Physics*, V. 36, No. 12, pp. 3770–3778 (1965). The silicon dioxide grows into and rises above the surface of the substrate to form isolation islands 20*a*, 20*c* and 20*e* which surround (in a three-dimensional structure) active device regions 15*b* and 15*d*. The predeposited field implant moves into the substrate ahead of the expanding mass of silicon dioxide and, due to the elevated temperature, is dispersed even further into the substrate as shown by region 17*c* of FIG. 3. Oxidation masking material 14 serves to prevent oxidation in the active device regions 15*b* and 15*d*. After formation of isolation islands 20, the masking material 14 along with the underlying silicon dioxide 12 is stripped by well-known etching techniques.

Next, a masking step as evidenced by a layer 21 of photoresist is performed to permit the predeposition of impurities in the p-well region. Then, both p-type and n-type impurities are introduced to the substrate and thermally driven in. This counterdoping procedure produces a highly desirable doping profile. The formation of this profile is described in detail in the copending application of Bruce E. Deal and Daniel C. Hu, Ser. No. 475,385 filed June 3, 1974, entitled "COMPLEMENTARY INSULATED GATE FIELD EFFECT TRANSISTOR STRUCTURE AND PROCESS FOR FABRICATING THE STRUCTURE." Briefly, a p-type impurity, e.g., boron, is implanted and thermally driven into the substrate to a depth of about 10$\mu$. Then a lesser amount of an n-type impurity, e.g., arsenic, is implanted and thermally driven into the substrate to a depth of about 4$\mu$. Alternatively, the two impurities are predeposited and driven in together. The arsenic counterdopes the boron to produce the composite concentration profile. The concentration of the p-type impurities in the profile achieved is great enough deep within the well so that the inversion threshold underneath the thick field oxide between the n-type substrate and the n-type source/drain regions of the n-channel device is suitably high and is low enough between the n-type source/drain regions of the n-channel device so that the n-channel device will operate at a suitably low threshold voltage. After the p-well drive-in, a layer of insulating material 30*b* and 30*d* is thermally grown on the major surface of substrate 10 in active device regions 15*b* and 15*d*. A layer of gate-forming conductive material 31 such as appropriately doped polycrystalline silicon is then formed over all regions of the device. As is well known in the semiconductor fabrication art, polycrystalline silicon can be used as a conductor of holes if impregnated with a p-type impurity, or as a conductor of electrons if impregnated with an n-type impurity. In the process and structure of the present invention, polycrystalline silicon serves as a primary layer of electrical interconnection of a double-layer device with aluminum serving as the upper or second layer.

Figure 4:
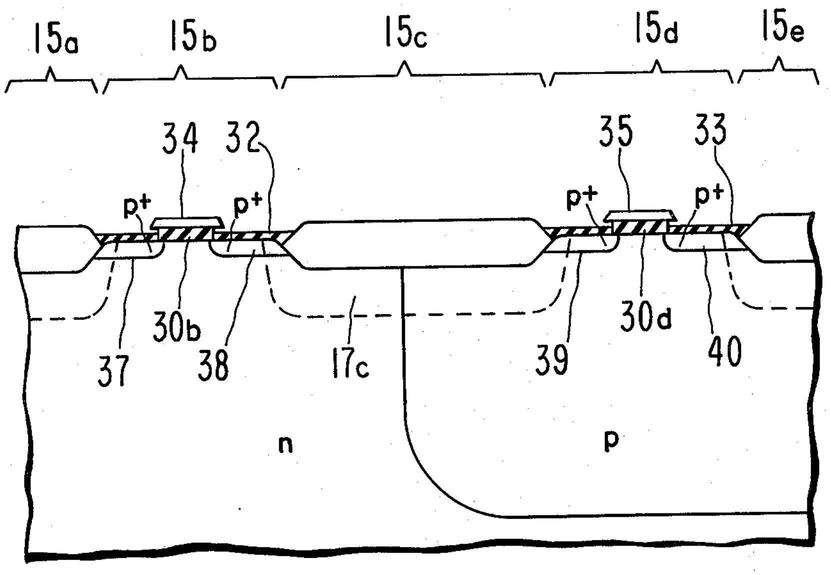
FIG. 4 is a further view of FIG. 3 after definition of the polycrystalline silicon gate electrodes, predeposition of $p^+$-type impurities indiscriminately in the source/drain regions of both the p-channel and n-channel devices, and reoxidation of the exposed substrate surfaces by thermal growth.
Figure 5:
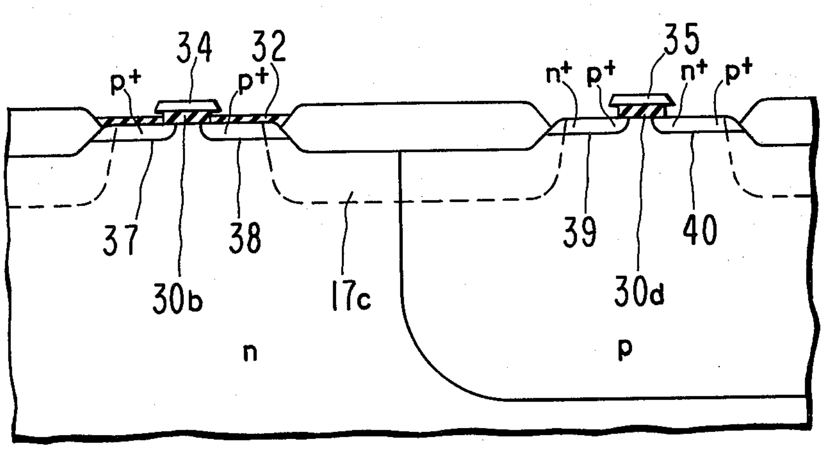
FIG. 5 is a further view of FIG. 4 after removal of the thermally grown reoxidation on the exposed substrate of the n-channel device by a masking step, and predeposition of $n^+$-type impurities in the source/drain regions of the n-channel device.

Referring now to FIG. 4, a masking step has been performed to define conductive material 31 and gate oxide 30*b* and 30*d* and thereby produce insulated gate electrodes 34 and 35. Then, a p-type impurity is indiscriminately introduced to the four source/drain diffusion regions 37, 38, 39 and 40. After predeposition they repose at a relatively shallow depth on the order of .2 –.3$\mu$ beneath the major surface of the substrate. In effect, the gate electrode structures serve as a mask so that the edges of the source/drain regions are self-aligned with the edges of the electrodes. The other edges of the source/drain diffusion regions are masked by the islands of field oxide. The beneficial effects of self-aligned structures such as lowered capacitance and increased packing density will ultimately be obtained. At this point, however, the source/drain regions are not yet formed as p-type impurities are only predeposited in the four regions.

The specific character of the source/drain regions 39 and 40 of the n-channel device to be formed is then established by reoxidizing the exposed substrate areas of the p-channel and n-channel devices by thermal growth to produce thin oxide layers 32 and 33 (FIG. 4). The thickness of the thermally grown oxide is capable of careful control and does not need to be densified as does commercially deposited silicon dioxide. Thin layer 33 over source/drain regions 39 and 40 is then removed. An $n^+$-type impurity is then predeposited, for example by diffusion or ion implantation in source/drain regions 39 and 40 to counterdope the $p^+$-type impurity previously predeposited. Polycrystalline silicon gate 35 again serves as a mask so that the boundaries of source/drain regions 39 and 40 remain self-aligned with the edges of gate electrode 35. If the $n^+$-type impurity is phosphorus and if diffusion is used to accomplish predeposition, the phosphorus will react with thin reoxidation layer 32 to form phosphosilicate glass during the elevated temperature segment of the predeposition cycle. This glass is readily removed by etching, e.g., in a hydroflouric bath. The presence of the reoxidation layer 32 effectively eliminates the necessity for an additional masking step to achieve the character of the $p^+$source/drain regions of the p-channel device. The relative concentrations of the p-type impurity and the n-type impurity introduced to source/drain regions 39 and 40 are such that a composite $n^+$ profile is achieved after thermal drive-in.

Figure 6:
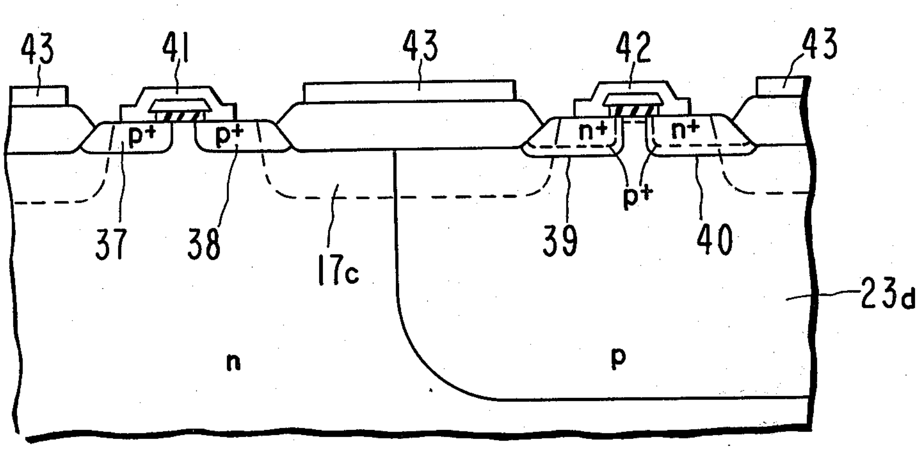
FIG. 6 is a further view of FIG. 5 after deposition of additional insulating material, phosphorus gettering and source/drain drive-in, and opening up electrical contact windows.

Referring now to FIG. 6, a layer 43 of additional electrical insulating material is formed across the surface of the structure. This material may be chemically deposited silicon dioxide. When it is defined to open up source/drain regions 37, 38, 39 and 40 for subsequent electrical contact formation, the unreacted portion of reoxidation layer 32 is also removed. The amount of reoxidation layer 32 to be removed at this point is controllably small since the original thickness of reoxidation layer 32 was carefully controlled. Thus, no deleterious undercutting of the oxide islands adjacent source/drain regions 39 and 40 occurs due to the additional etch time required to remove the unreacted portion of reoxidation layer 32.

The standard thermal drive-in step is then completed. Typically the substrate is heated to a temperature of 1,070°C. for a period of about 30 minutes. This drive-in is accomplished at the same time that phosphorus gettering is performed by passing a gas containing $POCl_3$, $O_2$ and $N_2$ over the substrate. The thermal drive-in of the source/drain diffusion regions 37, 38, 39 and 40 does not significantly affect the previously formed p-well 23*d* nor the $n^+$ field implant 17*c* because it previously was driven in at a temperature of 1,200°C. for a period of about 16 hours. As can be seen, the depth of source/drain regions 37 and 38 is equal to the penetration of the $p^+$-type impurities in source/drain regions 39 and 40. In regions 39 and 40, however, the $p^+$-type impurities have lost their identity. The character of source/drain diffusion regions 39 and 40 is $n^+$-type because, as stated above, the $n^+$-type impurities counterdope the $p^+$-type impurities. In essence the counterdoping procedure eliminates the separate masking and impurity-introduction steps normally required to produce the $n^+$-source/drain regions of the n-channel device.

Figure 8:
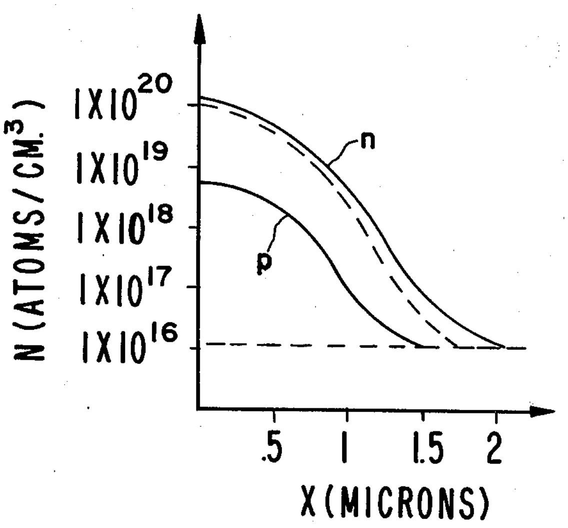
FIG. 8 is a graph illustrating the constituent impurity concentrations as a function of depth within an idealized $n^+$-source/drain region in an n-channel device.
Figure 9:
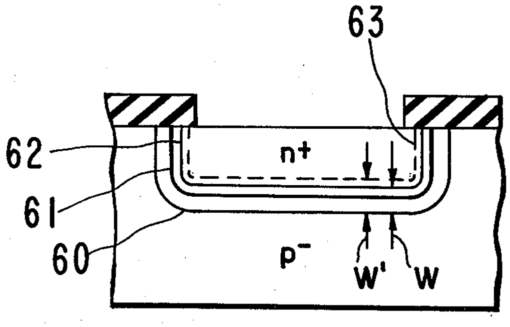
FIG. 9 is a pictorial diagram illustrating the location of space charge regions adjacent the NP junction of FIG. 8.

A further advantage of the counterdoping procedure is the acquired ability to carefully control the characteristics of the composite doping profile of the $n^+$-source/drain regions at their boundary with the p-well, a PN junction, By reference to the idealized doping curvest and PN junction of FIGS. 8 and 9, it can be seen that the control allows breakdown voltage across the junction to be tailored. FIG. 8 shows the concentration of n- and p-type impurities as a function of depth beneath the surface of a constant background (denoted by horizontal dotted line) substrate for a particular source/drain region. The composite doping profile is shown as a dotted line. The depth of the junction is the point at which the curve indicating the n-type impurity intersects the level of the background concentration, shown to be about $2 \times 10^{16}$ atoms/cm$^3$. It is evident that the shape of either impurity curve can be altered by varying the amount of impurities predeposited and the conditions of thermal drive-in and that the composite doping profile can be altered thereby. FIG. 9 illustrates pictorially the effect that the character of the slope of the doping profile has on the location of the space charge region about a PN junction. Generally, for a given breakdown voltage, the space charge region about a PN junction 61 will extend into the substrate as indicated by curve 60 and up into the diffused region as shown by curve 62. As is well known and as state above, broadening the space charge region will raise the avalanche junction breakdown voltage. This space charge region can be extended further into the substrate if the background concentration, i.e., the substrate doping, is reduced, or further into the diffused region as shown by dotted line 63 if either the diffused region is more lightly doped or the slope of the doping profile in the diffused region is reduced adjacent to the PN junction. The doping of the substrate cannot be varied solely to raise a particular avalanche breakdown voltage as other circuit design requirements must be met. And the magnitude of the source/drain region doping must be appropriate to achieve a suitable device threshold voltage. With a counterdoping procedure, however, the shape of the tail end of the composite doping profile can be tailored by adjusting the relative concentrations of the majority, e.g., n-type, and minority, e.g., p-type, impurities. The slope of the doping profile can then be reduced adjacent the PN junction. This is shown by the shape of the tail end of the composite doping profile of FIG. 8. Such shaping will broaden the space charge region from the width *w* to the width *w'* as shown in FIG. 9. Thus, the process of the present invention can be used to vary the avalanche junction breakdown voltage across the boundary of the source/drain region and the substrate or p-well and achieve a reduced valve therefor.

Figure 7:
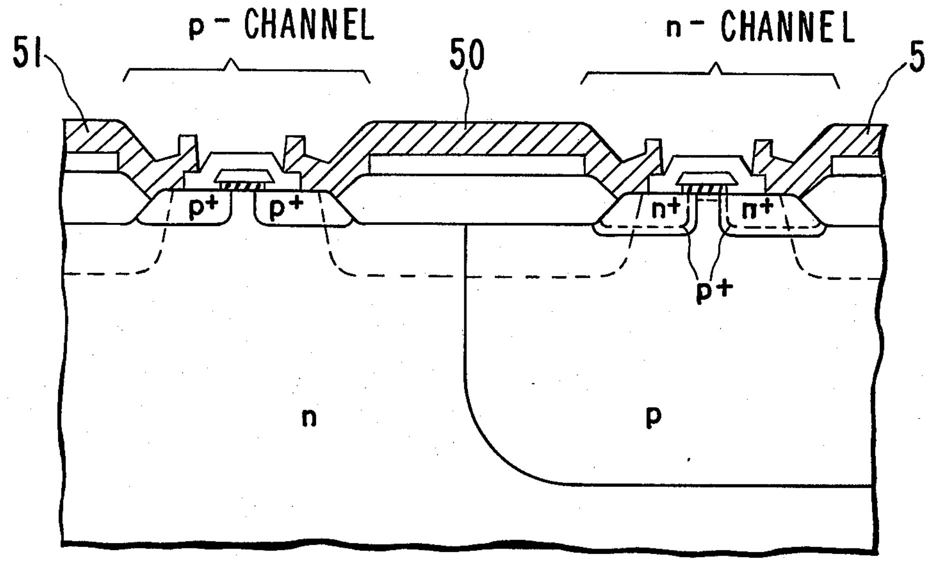
FIG. 7 is a further view of FIG. 6 after conductive connectors have been applied and defined to interconnect one $p^+$-source/drain region of the p-channel device and one $n^+$-source/drain region of the n-channel device and to provide external electrical communication.

An insulated gate complementary field effect device fabricated by the process of the present invention is shown in FIG. 7. Metal connectors 50 and 51 have been applied and defined to interconnect source/drain region 38 of the p-channel device with source/drain region 39 of the n-channel device and to provide external electrical communication with source/drain region 37 of the p-channel device and with source/drain region 40 of the n-channel device. In most commercial products a particular complementary field-effect transistor will be dedicated to perform a specified function in a particular circuit and will be electrically coupled in accordance with circuit requirements. The structure fabricated by the process of the present invention is functionally equivalent to the structure described in copending application Ser. No. 475,385 filed June 3, 1974 by Bruce E. Deal and Daniel C. Hu, entitled "COMPLEMENTARY INSULATED GATE FIELD EFFECT TRANSISTOR STRUCTURE AND PROCESS FOR FABRICATING THE STRUCTURE," but requires fewer process steps. The counterdoping of at least one of the source/drain regions has resulted in the simplification of the process sequence with the added feature of tailoring the composite doping profile to increase avalanche breakdown voltage across the PN junction. The use of thermally grown silicon dioxide as a mask results in further simplification.

What is claimed is:

1. In a process of fabricating a complementary insulated gate field effect transistor structure wherein n-channel and p-channel devices are fabricated in the same semiconductor substrate including the steps of forming a well of a first conductivity type in a substrate of a second and opposite conductivity type, forming a conductor-insulator-semiconductor field effect device having a second channel conductivity type within said well and forming a conductor-insulator-semiconductor field effect device having a first channel conductivity type in said substrate, the improvement comprising:

forming the source/drain regions of said conductor-insulator-semiconductor devices by:

introducing an impurity of a first conductivity type into the source/drain in regions of both of said devices, and introducing an impurity of a second conductivity type opposite to said first conductivity type into the source/drain regions of said device having said second channel conductivity type, the concentration of said impurity of said second conductivity type in said source/drain regions being greater than the concentration of said impurity of said first conductivity type so that the impurity of said second conductivity type counterdopes said impurity of said first conductivity type to produce source/drain regions of said second conductivity type.

2. A process in accordance with claim 1 wherein said first conductivity type is n, said second and opposite conductivity type is p, said first channel conductivity type is n-channel and said second channel conductivity type is p-channel.

3. A process in accordance with claim 1 wherein said first conductivity type is p, said second and opposite conductivity type is n, said first channel conductivity type is p-channel and said second channel conductivity type is n-channel.

4. A process in accordance with claim 3 including the step of forming oxide isolation regions in said substrate substantially surrounding and contiguous with said conductor-insulator-semiconductor devices.

5. A process in accordance with claim 4 wherein said step of introducing said p-type impurity into the source/drain regions of both of said devices is accomplished by implanting ions of said p-type conductivity.

6. A process in accordance with claim 5 wherein said step of introducing an impurity of n-conductivity type to said device having said n-channel conductivity type is accomplished by implanting ions of said n-conductivity type.

7. A process in accordance with claim 6 with the further step of thermally driving in said p-type and n-type implanted impurity ions.

8. A process in accordance with claim 7 wherein said step of introducing an impurity of n-conductivity type to said source/drain regions of said device having said n-channel conductivity type is further accomplished by thermally oxidizing the surface of said source/drain regions of said device having said p-channel conductivity type to mask said source/drain regions of said p-channel device and removing said thermally grown oxide after implantation of said n-conductivity type impurities.

9. A process in accordance with claim 7 wherein said n-type impurity is phosphorus and said p-type impurity is boron.

10. A process in accordance with claim 4 wherein said step of introducing an impurity of a p-conductivity type to the source/drain regions of both of said devices is accomplished by predepositing the p-conductivity type impurity by diffusion and subsequently thermally driving in the p-conductive type impurity and wherein said step of introducing the n-conductivity type impurity to the source/drain regions of said device having said n-channel conductivity type is accomplished by predepositing the n-conductivity type impurity by diffusion and subsequently thermally driving in said n-conductivity type impurity.

11. A process in accordance with claim 10 wherein said step of introducing an impurity of n-conductivity type to the source/drain regions of said device having said n-channel conductivity type is further accomplished by thermally oxidizing the surface of said source/drain regions of said device having said p-channel conductivity type to mask said source-drain regions of said p-channel device and removing said thermally grown oxide after diffusion of said n-conductivity type impurities.

12. A process in accordance with claim 10 wherein said n-type impurity is phosphorus and said p-type impurity is boron.

* * * * *